(12) United States Patent
Teshima et al.

(10) Patent No.: US 9,847,299 B2
(45) Date of Patent: Dec. 19, 2017

(54) SEMICONDUCTOR PACKAGE AND MOUNTING STRUCTURE THEREOF

(71) Applicant: Murata Manufacturing Co., Ltd., Nagaokakyo-shi, Kyoto-fu (JP)

(72) Inventors: Yuichiro Teshima, Nagaokakyo (JP); Toshiyuki Nakaiso, Nagaokakyo (JP); Yutaka Takeshima, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/232,959

(22) Filed: Aug. 10, 2016

(65) Prior Publication Data

US 2016/0351504 A1  Dec. 1, 2016

Related U.S. Application Data

(63) Continuation of application No. PCT/JP2015/076419, filed on Sep. 17, 2015.

(30) Foreign Application Priority Data

Sep. 30, 2014 (JP) ................................. 2014-201916
Nov. 4, 2014 (JP) ................................. 2014-224001

(51) Int. Cl.
*H01L 23/538* (2006.01)
*H01L 23/48* (2006.01)
(Continued)

(52) U.S. Cl.
CPC ........ *H01L 23/5384* (2013.01); *H01L 23/481* (2013.01); *H01L 23/49816* (2013.01);
(Continued)

(58) Field of Classification Search
CPC ........... H01L 23/5384; H01L 23/49816; H01L 23/481; H01L 24/16; H01L 25/18
See application file for complete search history.

(56) References Cited

U.S. PATENT DOCUMENTS 6,518,666 B1 * 2/2003 Ikeda ................... H01L 23/3735
257/706
7,378,733 B1 * 5/2008 Hoang .................... H01L 23/50
257/724
(Continued)

FOREIGN PATENT DOCUMENTS

JP  02-016791 A  1/1990
JP  03-000063 U  1/1991
(Continued)

OTHER PUBLICATIONS

International Search Report PCT/JP2015/076419, dated Nov. 17, 2015.
Written Opinion PCT/JP2015/076419, dated Nov. 17, 2015.

*Primary Examiner* — Christine Enad
(74) *Attorney, Agent, or Firm* — Arent Fox LLP

(57) ABSTRACT

A semiconductor package includes an interposer, a semiconductor element installed on a first surface of the interposer, bumps formed on a second surface of the interposer, and a chip component installed on the second surface of the interposer. The interposer is a silicon interposer; the semiconductor element is flip-chip mounted on the first surface of the interposer; the chip component is a thin film passive element formed by carrying out a thin film process on a silicon substrate, and a pad being formed on one surface of the thin film passive element; and the pad of the chip component is connected to a land formed on the second surface of the interposer using a conductive bonding material. According to this structure, the reliability of a bond between the interposer and the chip component of the semiconductor package can be ensured while achieving a small size.

19 Claims, 9 Drawing Sheets

(51) Int. Cl.
*H01L 23/498* (2006.01)
*H01L 23/00* (2006.01)
*H01L 25/00* (2006.01)
*H01L 25/18* (2006.01)
*H01L 23/50* (2006.01)
*H01L 23/66* (2006.01)
*H01L 29/06* (2006.01)

(52) U.S. Cl.
CPC .............. *H01L 23/50* (2013.01); *H01L 23/66* (2013.01); *H01L 24/05* (2013.01); *H01L 24/06* (2013.01); *H01L 25/00* (2013.01); *H01L 25/18* (2013.01); *H01L 23/49827* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 29/0657* (2013.01); *H01L 2224/0401* (2013.01); *H01L 2224/05554* (2013.01); *H01L 2224/06179* (2013.01); *H01L 2224/131* (2013.01); *H01L 2224/13144* (2013.01); *H01L 2224/16227* (2013.01); *H01L 2224/16235* (2013.01); *H01L 2224/32225* (2013.01); *H01L 2224/48091* (2013.01); *H01L 2224/48227* (2013.01); *H01L 2224/73265* (2013.01); *H01L 2224/81191* (2013.01); *H01L 2224/81193* (2013.01); *H01L 2224/81205* (2013.01); *H01L 2224/81444* (2013.01); *H01L 2224/81815* (2013.01); *H01L 2924/00014* (2013.01); *H01L 2924/10155* (2013.01); *H01L 2924/10162* (2013.01); *H01L 2924/1432* (2013.01); *H01L 2924/1433* (2013.01); *H01L 2924/14335* (2013.01); *H01L 2924/157* (2013.01); *H01L 2924/15311* (2013.01); *H01L 2924/181* (2013.01); *H01L 2924/19015* (2013.01); *H01L 2924/19041* (2013.01); *H01L 2924/19106* (2013.01)

(56) References Cited

U.S. PATENT DOCUMENTS

| | | | |
|---|---|---|---|
| 2004/0012085 | A1 | 1/2004 | Shioga et al. |
| 2006/0078248 | A1* | 4/2006 | Sasaki ................ G02B 6/4214 385/14 |
| 2007/0023922 | A1 | 2/2007 | Okane et al. |
| 2007/0291448 | A1* | 12/2007 | Cornelius ......... H01L 23/49822 361/679.31 |
| 2010/0214751 | A1 | 8/2010 | Aoki et al. |
| 2011/0110060 | A1* | 5/2011 | Togashi ............... H05K 1/0231 361/782 |
| 2014/0070368 | A1* | 3/2014 | Oyamada ........... H01L 25/0657 257/532 |
| 2014/0252544 | A1* | 9/2014 | Li .......................... H01L 23/50 257/532 |
| 2015/0145086 | A1* | 5/2015 | Rokuhara ............... H01S 5/005 257/432 |

FOREIGN PATENT DOCUMENTS

| | | |
|---|---|---|
| JP | H04328849 A | 11/1992 |
| JP | H0885000 A | 3/1994 |
| JP | 2004055759 A | 2/2004 |
| JP | 2005150283 A | 6/2005 |
| JP | 2007035884 A | 2/2007 |
| JP | 2007129046 A | 5/2007 |
| JP | 2007150181 A | 6/2007 |
| JP | 2008124165 A | 5/2008 |
| JP | 2010-199171 A | 9/2010 |
| WO | 2010137379 A | 12/2010 |

\* cited by examiner (Prior Art)

SEMICONDUCTOR PACKAGE AND MOUNTING STRUCTURE THEREOF

CROSS REFERENCE TO RELATED APPLICATIONS

The present application is a continuation of PCT/JP2015/076419 filed Sep. 17, 2015, which claims priority to Japanese Patent Application No. 2014-201916, filed Sep. 30, 2014, and Japanese Patent Application No. 2014-224001, filed Nov. 4, 2014, the entire contents of each of which are incorporated herein by reference.

FIELD OF THE INVENTION

The present disclosure relates to a semiconductor package containing a semiconductor element therein and having mounting bumps formed on a base surface, and a mounting structure for the semiconductor package.

BACKGROUND

In semiconductor devices that operate on the basis of clock signals, such as digital circuits, semiconductor devices that handle high-frequency signals, such as high-frequency circuits, and the like, the semiconductor devices are mounted on a printed circuit board. In this state, noise produced by current fluctuations can be superposed on a power source line and have a negative effect on the semiconductor device. A bypass capacitor (decoupling capacitor) is provided near a power supply terminal of the semiconductor device to remove such noise.

Meanwhile, a BGA ("Ball Grid Array") type semiconductor package including an interposer is an example of a packaged semiconductor device mounted on a surface of a printed circuit board ("semiconductor package" hereinafter).

FIG. 13 is a cross-sectional view illustrating several examples of a conventional mounting structure for the stated semiconductor package and the stated bypass capacitor. In each of examples (A), (B), and (C) in FIG. 13, a semiconductor element 2 is mounted on an upper surface of an interposer 1, the semiconductor element 2 is resin-sealed using a sealing resin 4, and bumps 3 are formed on a lower surface of the interposer. In the example (A), the semiconductor element 2 is wire-bonded to the upper surface of the interposer 1, a bypass capacitor 5 is mounted on a printed circuit board 6, and the semiconductor package is mounted thereupon. In the example (B), the semiconductor element 2 is flip-chip mounted onto the upper surface of the interposer 1. In the example (C), the bypass capacitor 5 is mounted on the lower surface of the interposer 1. In other words, the bypass capacitor 5 is mounted on the semiconductor package side.

Patent Document 1 discloses an example in which a bypass capacitor is mounted on a lower surface of a BGA-type semiconductor package.

Patent Document 1: Japanese Unexamined Patent Application Publication No. 2005-150283.

In the conventional mounting structures of the semiconductor package illustrated in FIGS. 13(A)-(C), there is a large distance from the semiconductor element 2 to the bypass capacitor 5 in the mounting structures of the semiconductor package indicated in (A) and (B), and thus an equivalent serial inductance (ESL) is high. However, in the mounting structure of the semiconductor package indicated in (C), the length of a current path from the semiconductor element 2 to the bypass capacitor 5 is short, and thus the ESL is low and a noise reduction effect is high.

However, the BGA-type semiconductor package disclosed in Patent Document 1 has the following problems to be solved.

(a) The interposer included in the BGA-type semiconductor package disclosed in Patent Document 1 is normally a glass epoxy substrate. Meanwhile, the bypass capacitor is a multi-layer ceramic capacitor (MLCC) having what is known as a dog bone-type terminal structure, in which electrodes are formed on five faces on both sides of the capacitor. A glass epoxy substrate and an MLCC have very different coefficients of linear expansion, and there is thus a risk of cracks forming at joint areas thereof depending on the thermal histories thereof.

(b) An MLCC element is ceramic, and therefore hard and brittle. Accordingly, when a BGA-type semiconductor package warps, stress concentrates at the joint areas thereof, which makes it easy for cracks to form in the joint areas.

(c) An MLCC has a dog bone-type terminal structure, and it is thus difficult to reduce gaps between the terminal and adjacent solder balls. There is thus a risk of short-circuits between the MLCC and interconnects on the printed circuit board where the BGA-type semiconductor package is to be mounted. It is also easy for stray capacitance arising between the interconnects of the printed circuit board and the MLCC to increase. In other words, an MLCC is not suited to a package in which solder balls are disposed at a high density.

As such, it is difficult to ensure bonding reliability between a chip capacitor and an interposer of a semiconductor package, and superior electrical characteristics with a small size and high density cannot be achieved.

SUMMARY OF THE INVENTION

An object of the present disclosure is to provide a semiconductor package, and a mounting structure thereof, that ensures bonding reliability between an interposer of a semiconductor package and a chip component, and that has superior electrical characteristics at a small size and high density.

A semiconductor package is disclosed that includes an interposer, a semiconductor element installed on a first surface of the interposer, bumps formed on a second surface of the interposer, and a chip component installed on the second surface of the interposer, wherein the interposer is a silicon interposer; the semiconductor element is mounted on a first surface of the interposer; the chip component is a thin film element formed by carrying out a thin film process on a silicon substrate, a pad being formed on one surface of the thin film element; and the pad of the chip component is connected to a land formed on the second surface of the interposer using a conductive bonding material.

According to this configuration, a semiconductor package capable of ensuring the reliability of bonding between the interposer and the chip component, and that has superior electrical characteristics at a small size and high density, is formed.

In the aforementioned embodiment, it is preferable that the semiconductor element be a processor unit, the chip component be a bypass capacitor (a decoupling capacitor); and the interposer include a through-hole that allows the semiconductor element and the chip component to be conductive with each other. According to this configuration, the length of a current path from the semiconductor element to the bypass capacitor is short, resulting in a low ESL and a high noise reduction effect. The ESL of the capacitor alone thus need not be very low.

In either aforementioned embodiment, it is preferable that the bumps be arranged in a grid shape, and that the chip component be disposed in a part of a region where the bumps are arranged (a region from which some of the bumps have been removed). According to this configuration, the chip component can be disposed without disturbing the grid-shaped arrangement of the bumps of the semiconductor package, and without disturbing the grid-shaped arrangement of the pads on the printed circuit board on which the semiconductor package is mounted. In particular, because the chip component is a terminal structure in which the pad is formed on a single surface, there are no electrodes on side surfaces of the chip component; additionally, because the chip component is formed through a thin film process, the number of missing bumps (that is, of the bumps arranged in a grid, the number of bumps that are removed in the arrangement pattern that removes some of the bumps) can be reduced without an outer dimension of the chip component being less precise than the arrangement dimensions of the bumps on the interposer.

In any of the aforementioned embodiments, it is preferable that the chip component include a resin layer on a surface of the chip component where the pad is formed. Doing so increases the shock-absorbing characteristics and elasticity of a pad formation surface of the chip component, which makes it possible to suppress stress on joint areas of the chip component even if the semiconductor package warps.

Moreover, it is preferable that the semiconductor element be sealed by a resin on the interposer. According to this configuration, a protective structure for the semiconductor element can be realized with ease. In particular, there is generally a large difference between the coefficient of linear expansion of the silicon substrate that forms the interposer and the coefficient of linear expansion of the sealing resin, which makes it easy for the semiconductor package to warp; however, the pad formation surface of the chip component has high shock-absorbing characteristics and elasticity, which keeps the joint areas of the chip component stable.

Further, in any of the aforementioned embodiments, it is preferable that the chip component have a quadrangular outer shape when viewed in plan view, and be installed at an orientation at which the four sides of the quadrangle are slanted relative to the directions in which the bumps are arranged. Through this, a semiconductor package including a chip component can be formed without greatly reducing the number of bumps formed on the interposer.

In any of the aforementioned embodiments, it is preferable that the pad of the chip component be rectangular when viewed in plan view, and be formed so that the sides of the rectangle are oriented in the directions in which the bumps are arranged. Through this, of the plurality of lands on the interposer, it is easy to ensure a gap between the land to which the pad of the chip component is connected and the lands on which bumps are provided, and easy to ensure a sufficient surface area for the land to which the pad of the chip component is connected.

In any of the aforementioned embodiments, it is preferable that the pad of the chip component be disposed in a corner portion of the outer shape of the chip component when viewed in plan view. Accordingly, a distance can be ensured between pads even when the chip component has a small outer size, which makes it easy to install the chip component on the interposer.

A mounting structure of a semiconductor package disclosed herein includes a printed circuit board and a semiconductor package mounted on the printed circuit board, wherein the semiconductor package includes an interposer, a semiconductor element installed on a first surface of the interposer, bumps formed on a second surface of the interposer, and a chip component installed on the second surface of the interposer; the interposer is a silicon interposer; the semiconductor element is flip-chip mounted on a first surface of the interposer; the chip component is a thin film passive element formed by carrying out a thin film process on a silicon substrate, a pad being formed on one surface of the thin film passive element; the pad of the chip component is connected to a land formed on the second surface of the interposer using a conductive bonding material; and a surface mount component is mounted on the printed circuit board between the chip component and the printed circuit board.

According to this configuration, a circuit capable of ensuring the reliability of bonding between the interposer and the chip component, and that has superior electrical characteristics at a small size and high density, is formed.

According to the present disclosure, a semiconductor package, and a mounting structure thereof, that ensures bonding reliability between an interposer of the semiconductor package and a chip component, and that has superior electrical characteristics at a small size and high density, is provided.

DETAILED DESCRIPTION OF THE EXEMPLARY EMBODIMENTS

First Embodiment

Figure 1:
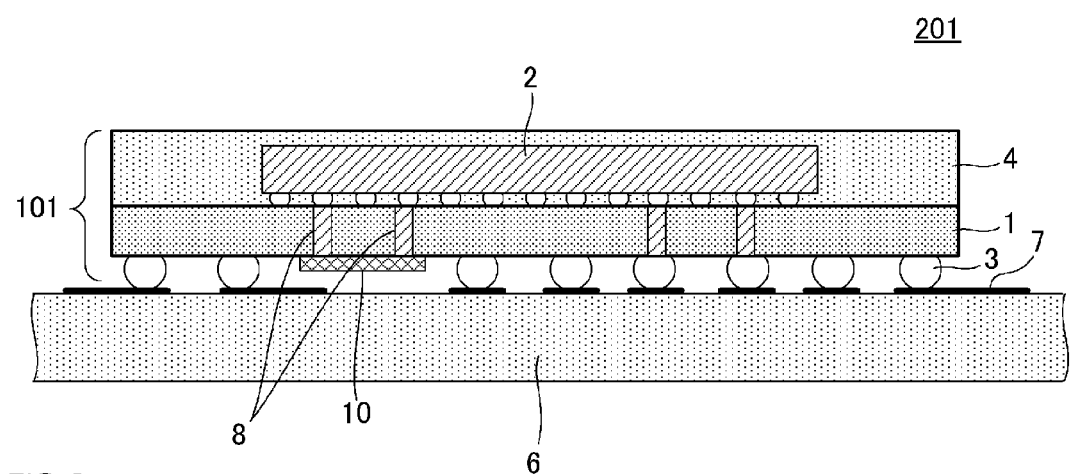
FIG. 1 is a cross-sectional view of a semiconductor package 101 and a mounting structure 201 thereof according to a first embodiment.

FIG. 1 is a cross-sectional view of a semiconductor package 101 and a mounting structure 201 thereof according to a first embodiment.

The semiconductor package 101 includes an interposer 1, a semiconductor element 2 disposed or formed on a first surface (an upper surface, in the orientation illustrated in FIG. 1) of the interposer 1, bumps 3 formed on a second surface of the interposer 1, and a chip component 10 disposed or formed on the second surface of the interposer 1.

The interposer 1 is an interposer made of silicon. The interposer 1 is formed from an Si single-crystal body or Si glass, for example. Lands for mounting the semiconductor element 2 are formed on the first surface of the interposer 1.

The semiconductor element 2 is a die cut from a wafer. The semiconductor element 2 is, for example, flip-chip mounted onto the first surface of the interposer 1. The semiconductor element 2 is sealed by a sealing resin 4 that covers the first surface of the interposer 1. The sealing resin 4 is an epoxy resin, for example.

A plurality of lands for providing solder balls are formed on the second surface of the interposer 1, and the bumps 3 are formed by solder balls being mounted on the lands using a solder ball mounter. Lands for installing a chip component 10 are formed on the second surface of the interposer 1, and the chip component 10 is disposed on these lands.

The semiconductor package 101 is mounted by the bumps 3 being bonded to lands 7 on a printed circuit board 6.

Figure 2:
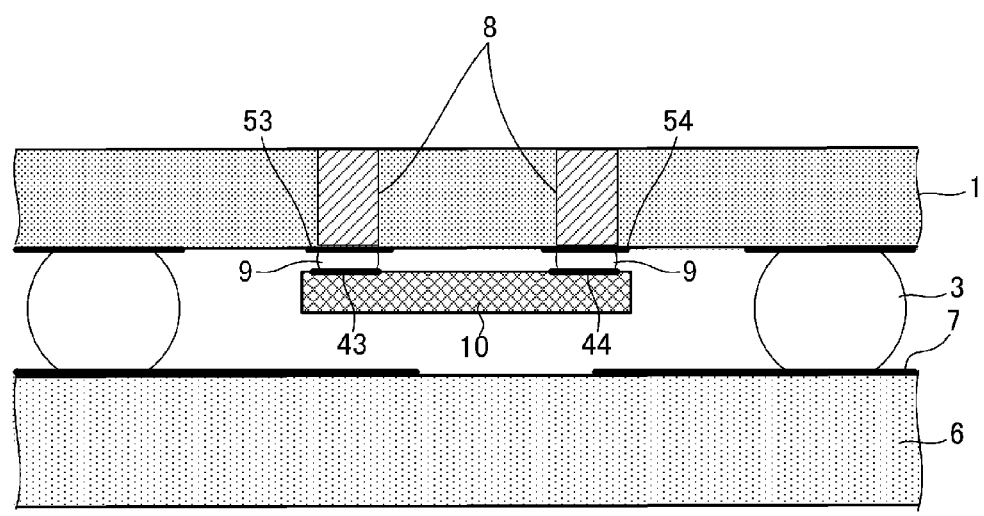
FIG. 2 is a cross-sectional view of the structure of an area where a chip component 10 is installed on an interposer 1.

FIG. 2 is a cross-sectional view of the structure of an area where the chip component 10 is disposed or formed on the interposer 1. The chip component 10 is a thin film passive element configured to be surface-mountable. In the present embodiment, the chip component 10 is a thin film capacitor and is used as a bypass capacitor (a decoupling capacitor). The chip component 10 is formed as a capacitor through a thin film process carried out on a silicon substrate, and the pads 43 and 44 are formed within an outer diameter dimension of a single surface (mounting surface) thereof. The pads 43 and 44 of the chip component 10 are connected using a conductive bonding material 9 such as solder to lands 53 and 54 formed on the second surface of the interposer 1.

The semiconductor element 2 illustrated in FIG. 1 is a processor unit such as a CPU (Central Processing Unit), an APU (Application Processing Unit), or the like. The interposer 1 includes through-holes 8 for enabling the semiconductor element 2 and the chip component 10 to be directly conductive. In other words, in the present embodiment, terminals on the semiconductor element 2 side and terminals on the chip component 10 side are connected without using a surface pattern for routing. The through-holes 8 are formed, for example, by first forming through-holes through reactive ion etching (RIE) (and deep RIE in particular) and then carrying out Cu sputtering and Cu plating on the inner surfaces thereof.

In the case where the conductive bonding material 9 is constituted of solder, the lands 53 and 54 formed on the second surface of the interposer 1 and the like are formed by sequentially providing a Ni plating film and an Au plating film on the surface of a Ti/Cu/Ti wiring layer, installing the solder balls on the lands 53 and 54 of the interposer 1 or the pads 43 and 44 of the chip component 10, and then soldering through a reflow process. Likewise, in the case where the conductive bonding material 9 is constituted of Au bumps, the lands 53 and 54 formed on the second surface of the interposer 1 and the like are formed by sequentially providing a Ni plating film and an Au plating film on the surface of a Ti/Cu/Ti wiring layer (with the Au plating film being thicker than the aforementioned plating films) and Au—Au bonding the chip component 10 to the interposer 1 through an ultrasonic bonding process. The chip component 10 may be directly connected to end faces of the through-holes 8 without using the land 53 or the like.

According to the above-described configuration, the length of a current path from the semiconductor element 2 to the chip component (bypass capacitor) 10 is short, resulting in a low ESL and a high noise reduction effect. In addition, a capacitor having a comparatively low capacitance is sufficient, and the ESL of the capacitor alone need not be very low.

Providing the above-described chip component 10 makes it possible to make a gap between the chip component and adjacent bumps (solder balls) 3 smaller than in the case where an MLCC having a dog bone-type terminal structure is used, and thus this technique is suited to packages in which the bumps (solder balls) are disposed at a high density. In addition, the pads 43 and 44 of the chip component 10 are formed only on the surface thereof that opposes the interposer 1, and thus there is no risk of short-circuits between the chip component 10 and the interconnects on the printed circuit board 6 on which the semiconductor package 101 is to be mounted. Furthermore, compared to an MLCC, the element body of the chip component 10 is a silicon substrate, and thus the material has a low dielectric constant (a relative dielectric constant of approximately 10 to 11), with a low stray capacitance between the interconnects of the printed circuit board 6 and the chip component 10.

Figure 3:
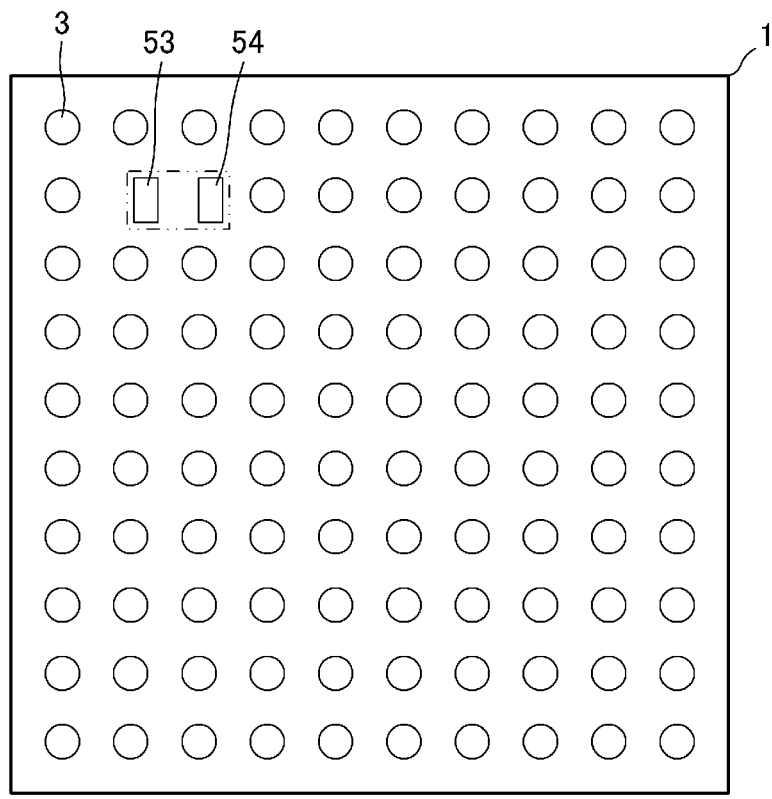
FIG. 3 is a plan view of a second surface of the interposer 1.

FIG. 3 is a plan view of the second surface of the interposer 1. The bumps 3 are formed in a grid-shaped arrangement on the second surface of the interposer 1. Furthermore, the lands 53 and 54 for installing the chip component are disposed on the second surface of the interposer 1 in part of a range where the bumps 3 are arranged (a region from which some of the bumps 3 have been removed). The pads 43 and 44 of the chip component 10 are connected to the lands 53 and 54 using the conductive bonding material 9. According to this configuration, the chip component 10 can be disposed without disturbing the grid-shaped arrangement of the bumps of the (interposer 1 of the) semiconductor package 101, and without disturbing the grid-shaped arrangement of the pads on the printed circuit board on which the semiconductor package 101 is mounted. The semiconductor package 101 can then be handled as a normal BGA-type semiconductor package.

Next, the configuration of the aforementioned chip component 10 will be described with reference to FIGS. 4 to 6.

Figure 4:
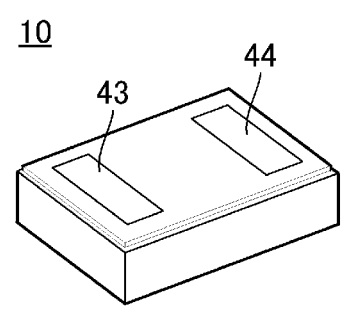
FIG. 4 is an external perspective view of a pad formation surface side of the chip component 10.

FIG. 4 is an external perspective view of the pad formation surface side of the chip component 10. The pads 43 and 44, used for input and output, are formed on a single surface (an upper surface, in the orientation illustrated in FIG. 4) of the chip component 10. In other words, the chip component is a surface mount component having LGA-type terminal electrodes.

Figure 5:
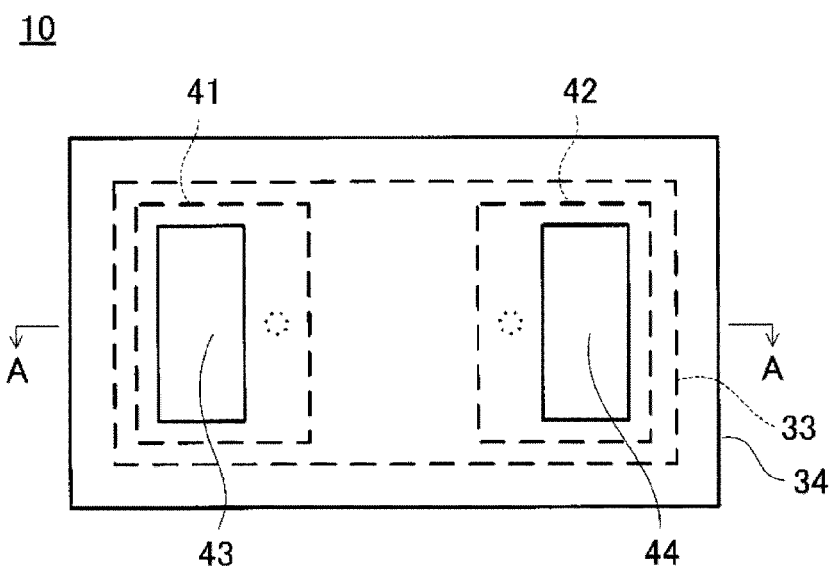
FIG. 5 is a plan view of the pad formation surface side of the chip component 10.
Figure 6:
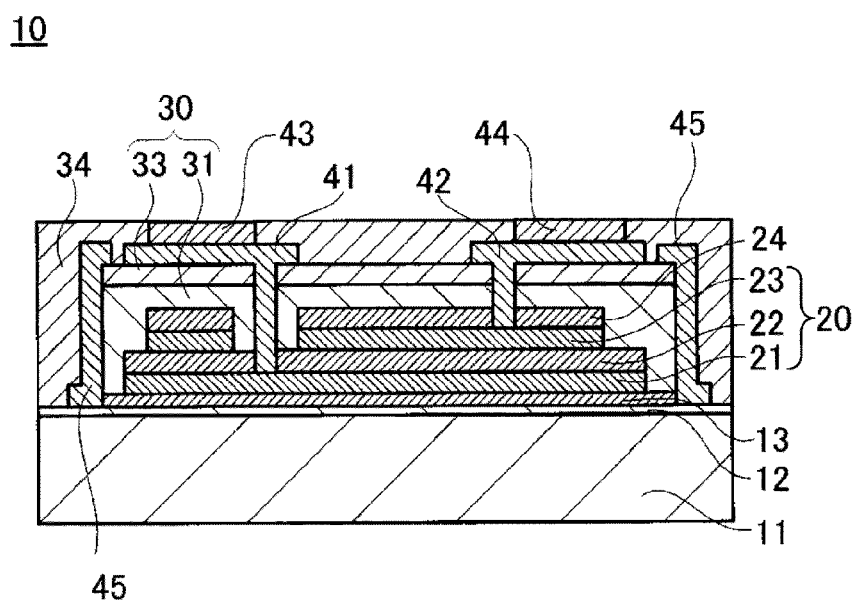
FIG. 6 is a cross-sectional view of an area A-A illustrated in FIG. 5.

FIG. 5 is a plan view of the pad formation surface side of the chip component 10. FIG. 6 is a cross-sectional view of an area A-A illustrated in FIG. 5.

The chip component 10 is a thin film capacitor element, and includes a substrate 11, a contact layer 13, a capacitance portion 20, and a protective layer 30.

An Si single-crystal substrate can be given as an example of the material of the substrate 11. It is preferable that an oxide layer 12 be formed on a surface of the substrate 11. The oxide layer 12 is provided for the purpose of preventing mutual diffusion between the substrate 11 and the contact layer 13. The oxide layer 12 is formed, for example, through a thermal process on the substrate 11.

The contact layer 13 is formed upon one main surface of the substrate 11. The contact layer 13 ensures close contact between the oxide layer 12 of the substrate 11 and a lower electrode layer 21.

The capacitance portion 20 includes the lower electrode layer 21, a dielectric layer 22, and an upper electrode layer 23. The lower electrode layer 21 is formed on the contact layer 13. The dielectric layer 22 is formed on the lower electrode layer 21. The upper electrode layer 23 is formed on the dielectric layer 22.

A conductive metal material is used as the lower electrode layer 21 and the upper electrode layer 23. Specifically, a high-melting point noble metal having good conductivity and superior resistance to oxidization is preferable (Au or Pt, for example).

A dielectric material is used for the dielectric layer 22. A bismuth laminar compound such as $(Ba,Sr)TiO_3$, $SrTiO_3$, or $BaTiO_3$, $Pb(Zr,Ti)O_3$, $SrBi_4Ti_4O_{15}$, or the like can be given as an example of the dielectric material.

An inorganic insulating layer 24 is provided on the upper electrode layer 23. The inorganic insulating layer 24 is provided in order to improve the close contact between the upper electrode layer 23 and the protective layer 30.

The protective layer 30 is formed so as to cover the capacitance portion 20 and the inorganic insulating layer 24. The protective layer 30 is formed so as to prevent moisture from entering into the capacitance portion 20. The protective layer 30 includes an inorganic protective layer 31 and an organic protective layer 33. $SiN_x$, $SiO_2$, $Al_2O_3$, and $TiO_2$ can be given as examples of the material of the inorganic protective layer 31. Polyimide resin, epoxy resin, and the like can be given as examples of the material of the organic protective layer 33.

In the present embodiment, an end portion of the contact layer 13 is exposed from the inorganic protective layer 31. In other words, the contact layer 13 is interposed between the inorganic protective layer 31 and the substrate 11, and thus the contact layer 13 prevents the inorganic protective layer 31 and the substrate 11 from separating.

The pad 43 is electrically connected to the lower electrode layer 21 through an extended electrode 41. The extended electrode 41 is formed so as to pass through the dielectric layer 22, the inorganic protective layer 31, and the organic protective layer 33. The extended electrode 41 extends to an area above the organic protective layer 33. Meanwhile, the pad 44 is electrically connected to the upper electrode layer 23 through an extended electrode 42. The extended electrode 42 is formed so as to pass through the inorganic insulating layer 24, the inorganic protective layer 31, and the organic protective layer 33. The extended electrode 42 extends to an area above the organic protective layer 33.

The pads 43 and 44 are formed having a dual-layer structure, with a lower layer of Ni and an upper layer of Au, for example. The extended electrodes 41 and 42, meanwhile, are formed having a dual-layer structure, with a lower layer of Ti and an upper layer of Cu, for example.

In the present embodiment, a metal film 45 is formed on at least part of an end portion of the protective layer 30. It is preferable that the metal film 45 be in contact with the contact layer 13. In other words, the contact layer 13 extends to a position that makes contact with the metal film 45. The presence of the metal film 45 prevents moisture from entering into defects between the protective layer 30 and the substrate 11.

Meanwhile, it is preferable that the metal film 45 be formed so as to cover an outer peripheral portion of a junction border between the inorganic protective layer 31 and the organic protective layer 33. This prevents moisture from entering into the junction border between the inorganic protective layer 31 and the organic protective layer 33 from the outer peripheral portion thereof.

The metal film 45 is formed having a dual-layer structure, with a lower layer of Ti and an upper layer of Cu, for example.

An organic insulating layer 34 is formed so as to cover the inorganic protective layer 31 and the organic protective layer 33, the extended electrodes 41 and 42, and the metal film 45. The pads 43 and 44 are formed so as to be exposed on the surface of the chip component 10. The material of the organic insulating layer 34 is polyimide resin, epoxy resin, or the like, for example.

In this manner, the organic insulating layer 34, which is a resin layer, is present on the surface of the chip component 10 where the pads 43 and 44 are formed. This increases the shock-absorbing characteristics and elasticity of the surface of the chip component 10 where the pads 43 and 44 are formed, which makes it possible to suppress stress on joint areas of the chip component even if the semiconductor package warps. Particularly in the case where the semiconductor element 2 is sealed with the sealing resin 4 that covers the first surface of the interposer 1, there is generally a large difference between the coefficient of linear expansion of the silicon substrate that forms the interposer 1 and the coefficient of linear expansion of the epoxy resin serving as the sealing resin, which makes it easy for the semiconductor package 101 to warp. However, the pad formation surface of the chip component 10 has high shock-absorbing characteristics and elasticity, which keeps the joint areas of the chip component 10 stable.

In the present embodiment, the chip component 10 is formed through a thin film process, which makes it possible to reduce the profile of the chip component 10; this technique is thus suited to disposing the chip component in the narrow space between the interposer 1 and the printed circuit board 6. In other words, a height of the chip component 10 after mounting (30 to 90 µm, for example) can be kept within a height dimension of the bumps 3 (100 µm, for example).

In addition, like the interposer 1, the chip component 10 uses a silicon substrate, which keeps the coefficients of linear expansion of the two elements substantially the same; accordingly, the chip component 10 and the interposer 1 exhibit the same expansion and contraction behavior during thermal cycles, which ensures a high mounting reliability.

Furthermore, because the chip component 10 is a terminal structure in which the pads are formed on a single surface, there are no electrodes on side surfaces of the chip component 10; additionally, because the chip component 10 is formed through a thin film process, the number of missing bumps (that is, of the bumps arranged in a grid, the number of bumps that are removed in the arrangement pattern that removes some of the bumps) can be reduced without an outer dimension of the chip component 10 being less precise than the arrangement dimensions of the bumps on the interposer 1.

Second Embodiment

Figure 7:
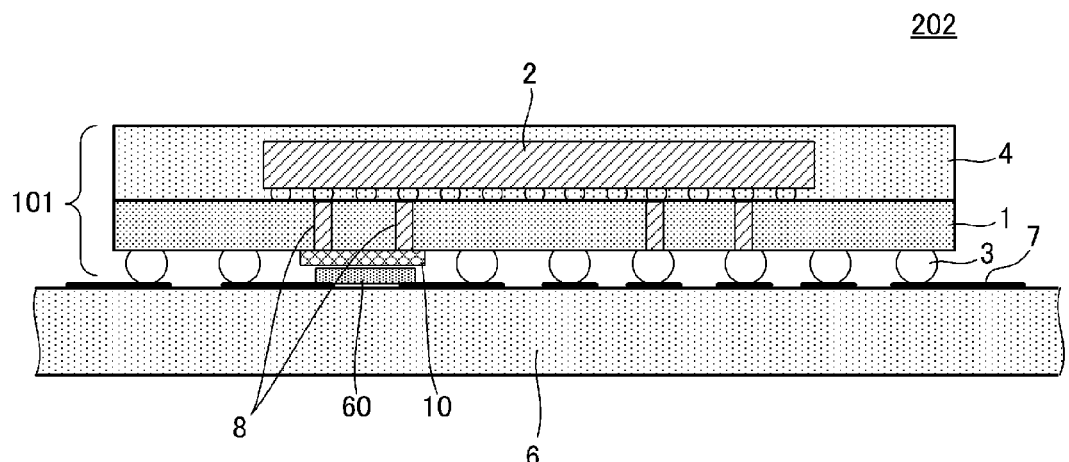
FIG. 7 is a cross-sectional view of a mounting structure 202 of a semiconductor package according to a second embodiment.
Figure 8:
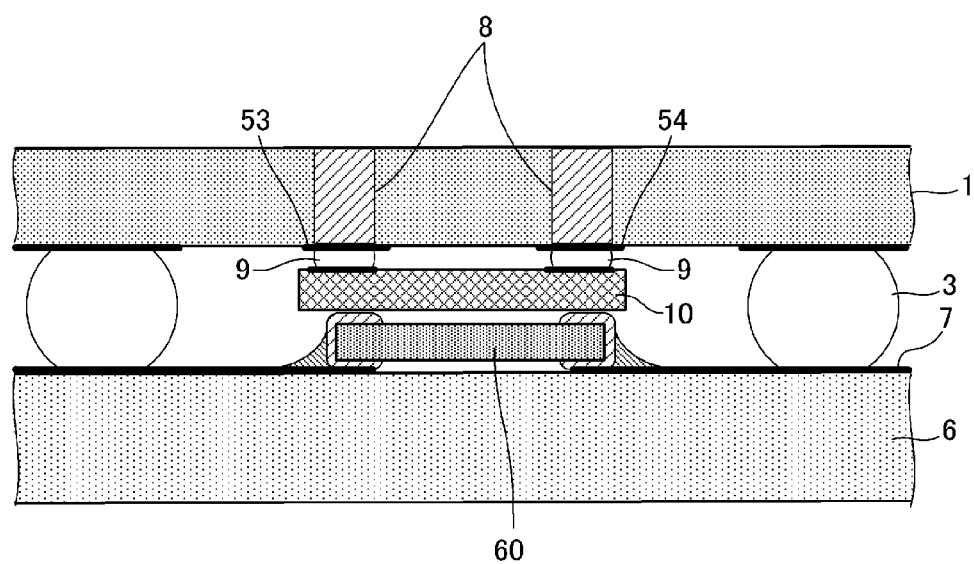
FIG. 8 is a cross-sectional view of primary elements in the mounting structure of the semiconductor package according to the second embodiment.

FIG. 7 is a cross-sectional view of a mounting structure 202 of a semiconductor package according to a second embodiment. FIG. 8 is a cross-sectional view of primary elements in the mounting structure of the semiconductor package according to the second embodiment. Parts illustrated in FIG. 8 are parts corresponding to FIG. 2 described in the first embodiment.

Unlike the mounting structure of a semiconductor package described in the first embodiment, in the mounting structure of a semiconductor package according to the second embodiment, a surface mount component 60 is mounted on the printed circuit board 6 between the chip component 10 and the printed circuit board 6.

As illustrated in FIG. 8, this surface mount component 60 is a multi-layer ceramic capacitor (MLCC) having a dog bone-type terminal structure. The surface mount component 60 is also used as a bypass capacitor. The surface mount component 60 has a higher ESL than the chip component 10, but is a high-capacitance capacitor. Furthermore, the length of the path between the semiconductor element 2 and the surface mount component 60 is comparatively long, and thus the ESL including that path is high. However, because the surface mount component 60 is a comparatively high-capacitance capacitor, the surface mount component 60 is used as a bypass capacitor that effectively suppresses low-frequency noise. Meanwhile, even if the chip component 10 is a comparatively low-capacitance capacitor, the ESL thereof is low, and thus the chip component 10 is used as a bypass capacitor that effectively suppresses high-frequency noise. Like the chip component 10, a thin film capacitor element may be used as the surface mount component.

Because the surface of the chip component 10 that faces the printed circuit board 6 is an insulative material, no electrical problems arise even if a gap between the chip component 10 and the surface mount component 60 is extremely narrow. Furthermore, short-circuits do not occur even when the chip component 10 and the surface mount component 60 are in contact, to the extent that the contact does not damage those components.

Third Embodiment

A third embodiment describes the configuration of a chip component and a structure for installing the chip component on an interposer in particular.

Figure 9A:
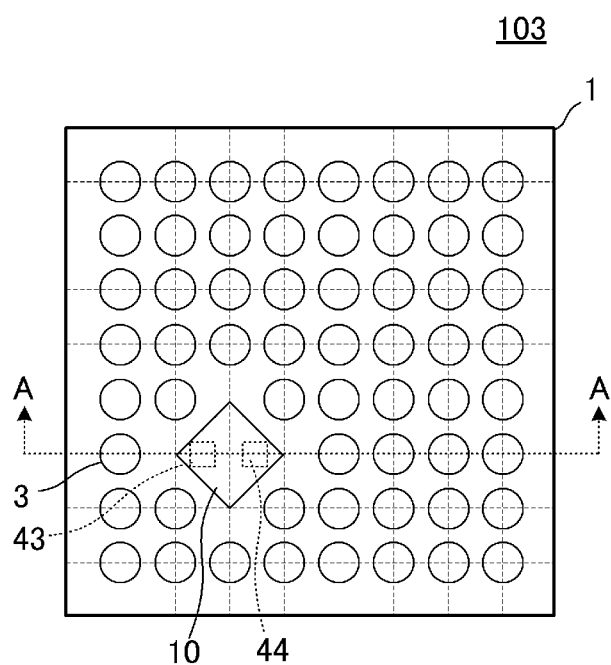
FIGS. 9(A) and 9(B) are diagrams illustrating a mounting structure of a semiconductor package according to a third embodiment.
Figure 9B:
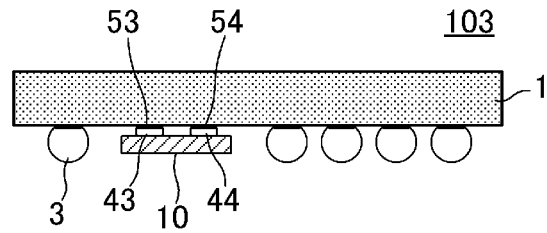

FIG. 9(A) is a plan view of the second surface of the interposer 1 in a semiconductor package 103 according to the present embodiment. FIG. 9(B) is a cross-sectional view of an area A-A illustrated in FIG. 9(A).

The bumps 3 are formed in a grid-shaped arrangement on the second surface of the interposer 1. Meanwhile, the lands 53 and 54 for installing the chip component 10 are disposed on the second surface of the interposer 1 in part of a range where the bumps 3 are arranged (a region from which some of the bumps 3 have been removed). The pads 43 and 44 of the chip component 10 are connected to the lands 53 and 54 using the conductive bonding material 9.

The chip component 10 has a quadrangular outer shape when viewed in plan view, and is disposed at an orientation at which the four sides of the quadrangle are slanted relative to the directions in which the bumps 3 are arranged. The other constituent elements are the same as those described in the first embodiment.

Figure 10A:
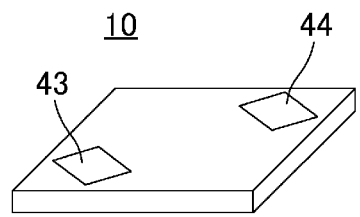
FIGS. 10(A), 10(B), and 10(C) are diagrams illustrating the configuration of a chip component provided in the semiconductor package according to the third embodiment.
Figure 10B:
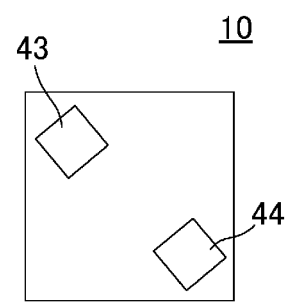
Figure 10C:
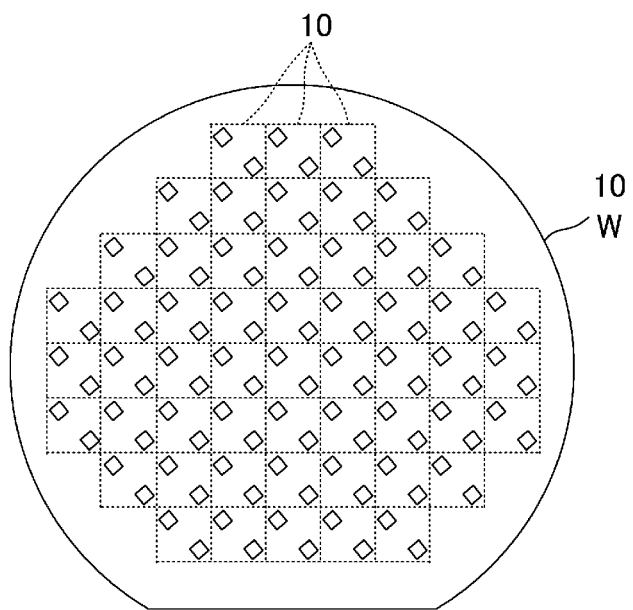

FIG. 10(A) is a perspective view of the chip component 10, and FIG. 10(B) is a plan view of the chip component 10. FIG. 10(C), meanwhile, is a plan view of a wafer before cutting out the chip component 10.

The chip component 10 is cut out from a silicon substrate (a wafer). In other words, a plurality of circuits for chip components such as thin film capacitors are formed on a silicon substrate 10W through a thin film process, and are ultimately separated into a plurality of the chip components 10 by cutting with a dicing machine.

The chip component 10 has a quadrangular outer shape when viewed in plan view, and the pads 43 and 44 of the chip component 10 are disposed at corner portions of that outer shape when viewed in plan view.

The plurality of vertical and horizontal broken lines drawn in FIG. 9 indicate the directions in which the bumps 3 of the interposer are arranged. As illustrated in FIG. 9, the chip component 10 has a quadrangular outer shape when viewed in plan view, and is disposed at an orientation at which the four sides of the quadrangle are slanted relative to the directions in which the bumps 3 are arranged. In addition, the pads 43 and 44 of the chip component 10 are disposed in the corner portions of that outer shape when viewed in plan view. Furthermore, the pads 43 and 44 of the chip component 10 are rectangular when viewed in plan view, and are formed so that the sides of those rectangles are oriented in the directions in which the bumps 3 are arranged.

Note that the chip component 10 is not limited to a passive element such as a thin film capacitor, and an active element such as a transistor, an integrated circuit including such elements, and the like can be applied in the same manner.

According to the present embodiment, the chip component 10 can be disposed without disturbing the grid-shaped arrangement of the bumps of the (interposer 1 of the) semiconductor package 103, and without disturbing the grid-shaped arrangement of the pads on the printed circuit board on which the semiconductor package 103 is mounted. The semiconductor package 103 can then be handled as a normal BGA-type semiconductor package. In particular, the chip component 10 has a quadrangular outer shape when viewed in plan view, and is disposed at an orientation at which the four sides of the quadrangle are slanted relative to the directions in which the bumps 3 are arranged; accordingly, the semiconductor package including the chip component can be formed without greatly reducing the number of bumps arranged on the interposer 1.

Figure 12A:
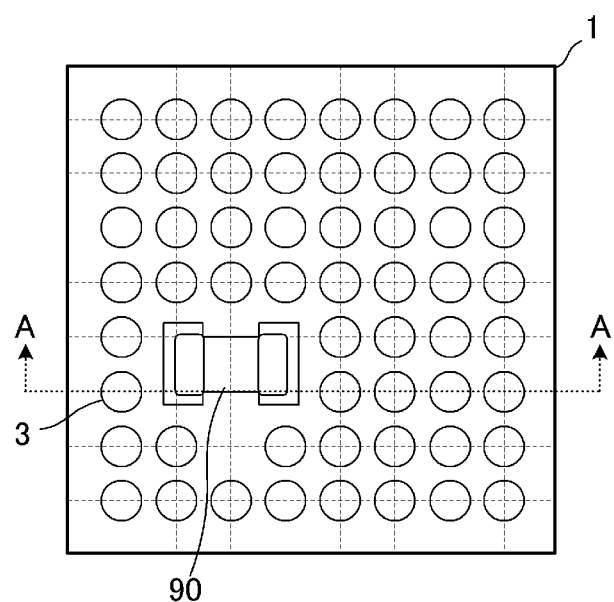
FIGS. 12(A) and 12(B) are diagrams illustrating a mounting structure of a semiconductor package according to a comparative example.
Figure 12B:
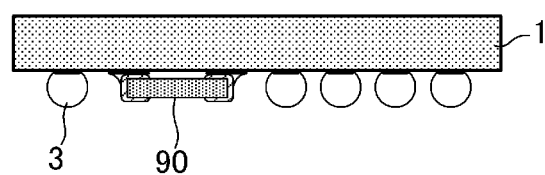
Figure 13A:
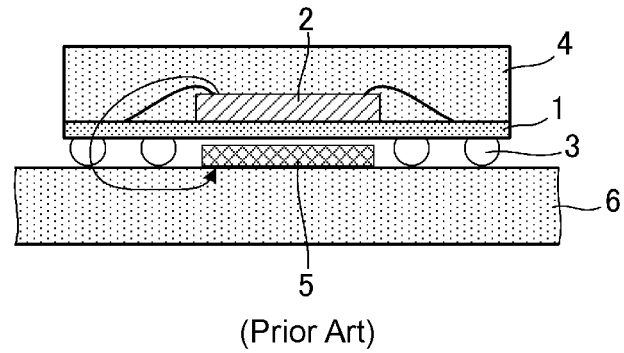
FIGS. 13(A) to 13(C) is a cross-sectional view illustrating several examples of a conventional mounting structure for a semiconductor package and a bypass capacitor.
Figure 13B:
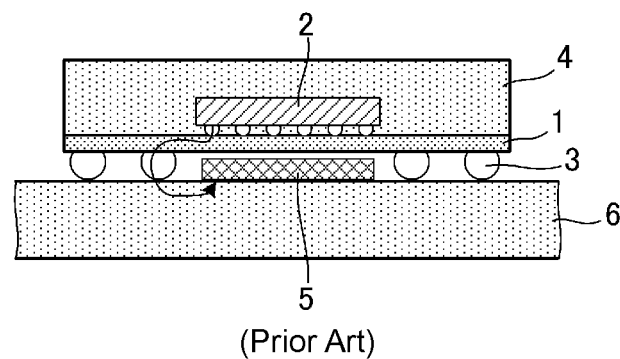
Figure 13C:
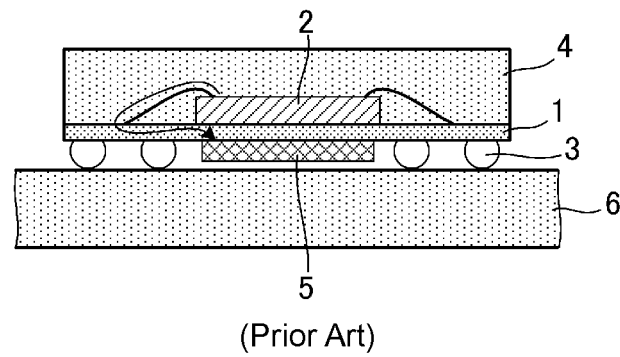

Here, FIGS. 12(A) and 12(B) are diagrams illustrating a mounting structure of a semiconductor package according to a comparative example. FIG. 12(A) is a plan view of the second surface of the interposer 1. FIG. 12(B) is a cross-sectional view of an area A-A illustrated in FIG. 12(A).

In this comparative example, a chip component 90, having what is known as a dog bone-type terminal structure in which electrodes are formed on five faces on both ends of the component, is installed. The planar surface area of the chip component is the same as the planar surface area of the chip component 10 illustrated in FIG. 9. According to the comparative example illustrated in FIGS. 12(A) and 12(B), it is necessary to remove six bumps and form lands and the like for installing the chip component in the resulting region.

However, with the semiconductor package 103 according to the present embodiment illustrated in FIGS. 9(A) and 9(B), it is sufficient to provide a region from which five bumps have been removed from the interposer 1. Through this, a semiconductor package including a chip component can be formed without greatly reducing the number of bumps formed on the interposer.

In addition, according to the present embodiment, the pads 43 and 44 of the chip component 10 are rectangular when viewed in plan view, and are formed so that the sides of those rectangles are oriented in the directions in which the bumps 3 are arranged. Accordingly, of the plurality of lands on the interposer 1, it is easy to ensure a gap between the lands 53 and 54 to which the pads 43 and 44 of the chip component 10 are connected and the lands on which bumps are provided, and easy to ensure a sufficient surface area for the lands 53 and 54 to which the pads 43 and 44 of the chip component 10 are connected.

In addition, according to the present embodiment, the pads 43 and 44 of the chip component 10 are disposed in the corner portions of the outer shape of the chip component 10 when viewed in plan view. Accordingly, a distance can be ensured between the pads 43 and 44 even when the chip component 10 has a small outer size, which makes it easy to install the chip component on the interposer 1.

Note that in the case where the chip component 10 has two pads, it is preferable that the pads be disposed in respective opposing corner portions, as illustrated in FIGS. 9(A) and 9(B). However, the chip component 10 may have three or more pads.

Fourth Embodiment

Figure 11A:
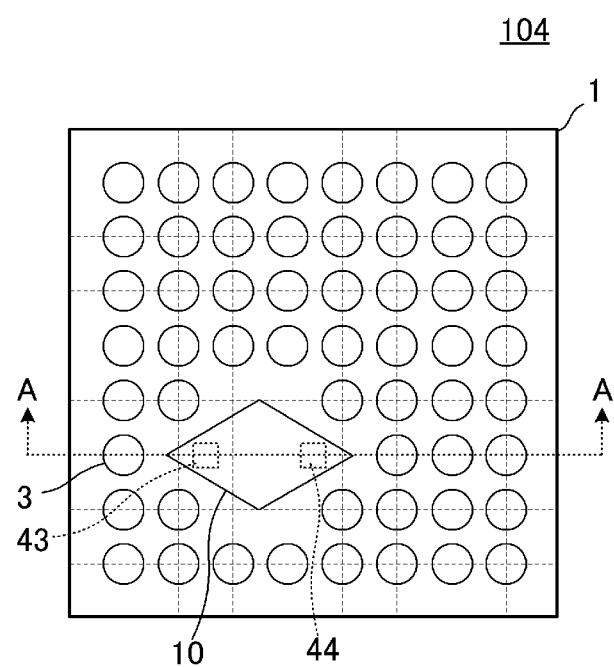
FIGS. 11(A) and 11(B) are diagrams illustrating a mounting structure of a semiconductor package according to a fourth embodiment.
Figure 11B:
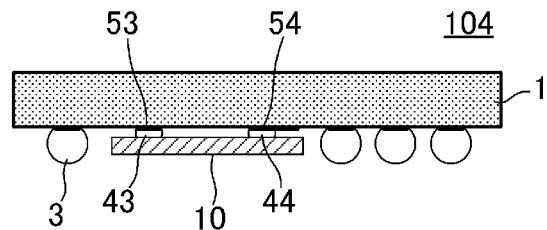

FIGS. 11(A) and 11(B) are diagrams illustrating a mounting structure of a semiconductor package 104 according to a fourth embodiment. The shape of the chip component 10 differs from that in the third embodiment. In the present embodiment, the chip component 10 has a diamond shape when viewed in plan view. In terms of surface area efficiency when cutting the chip component out from a semiconductor substrate, it is normally preferable that the chip component have a quadrangular shape, but the shape is not limited to a rectangle. The chip component may have a diamond shape, a parallelogram shape, or the like when viewed in plan view, as described in the present embodiment. The chip component according to the exemplary embodiment is a thin film element, and can be formed in a variety of shapes in addition to a rectangle, particularly in the case where the component is formed through a method that cuts the thin film element from a wafer. Accordingly, an appropriate shape can be selected in consideration of the arrangement of the pads on the interposer on which the component is installed and the like.

Although FIGS. 1 and 7 illustrate examples in which a single semiconductor element 2 is installed on the interposer 1, a plurality of semiconductor elements may be installed on the interposer 1.

In addition, although the above embodiments describe the chip component 10 as being a thin film capacitor, any thin film passive element in which the element is formed on a silicon substrate through a thin film process and pads are formed on one surface thereof can be applied in the same manner. For example, a thin film inductor, a thin film resistance element, and the like can be applied in the same manner.

Finally, the aforementioned embodiments are in all ways as exemplary and in no ways limiting. It is clear that variations and changes can be made as appropriate by one skilled in the art. The scope of the present invention is defined not by the above embodiments but by the scope of the appended claims. Furthermore, the scope of the present invention is intended to include all modifications within the scope and meaning equivalent to the scope of the appended claims.

REFERENCE SIGNS LIST

1 INTERPOSER
2 SEMICONDUCTOR ELEMENT
3 BUMP
4 SEALING RESIN
5 BYPASS CAPACITOR
6 PRINTED CIRCUIT BOARD
7 LAND
8 THROUGH-HOLE
9 CONDUCTIVE BONDING MATERIAL
10 CHIP COMPONENT
11 SUBSTRATE
12 OXIDE LAYER
13 CONTACT LAYER
20 CAPACITANCE PORTION
21 LOWER ELECTRODE LAYER
22 DIELECTRIC LAYER
23 UPPER ELECTRODE LAYER
24 INORGANIC INSULATING LAYER
30 PROTECTIVE LAYER
31 INORGANIC PROTECTIVE LAYER
33 ORGANIC PROTECTIVE LAYER
34 ORGANIC INSULATING LAYER
41, 42 EXTENDED ELECTRODE
43, 44 PAD
45 METAL FILM
53, 54 LAND
60 SURFACE MOUNT COMPONENT
101, 103, 104 SEMICONDUCTOR PACKAGE
201, 202 MOUNTING STRUCTURE OF SEMICONDUCTOR PACKAGE

The invention claimed is:

1. A semiconductor package comprising:
an interposer formed from silicon;
a semiconductor element mounted on a first surface of the interposer;
a plurality of bumps disposed on a second surface of the interposer that is opposite the first surface, the plurality of bumps having a grid-shaped arrangement on the second surface; and
a chip component disposed on the second surface of the interposer between at least a pair of the plurality of bumps, the chip component having a rectangular shape at least one side slanted in a plan view of the semiconductor package relative to the grid-shaped arrange of the plurality of bump,
wherein the chip component is a thin film element formed by a thin film process on a silicon substrate and includes at least one pad is disposed a corner portion on one surface of the thin film element and being connected to a land disposed on the second surface of the interposer using a conductive bonding material.

2. The semiconductor package according to claim 1, wherein the semiconductor element is a processor unit, the chip component is a bypass capacitor and the interposer comprises at least one through-hole that electrically connects the semiconductor element to the chip component.

3. The semiconductor package according to claim 1, wherein the chip component is disposed in a part of a region where at least a portion of the plurality of bumps are arranged.

4. The semiconductor package according to claim 1, wherein the chip component includes a resin layer on a surface of the chip component where the at least one pad is disposed.

5. The semiconductor package according to claim 1, wherein the semiconductor element is sealed by a resin on the interposer.

6. The semiconductor package according to claim 1,
wherein the chip component has a quadrangular outer shape when viewed the plan view of the semiconductor package, and
wherein the chip component is disposed on the second surface of the interposer at an orientation at which the four sides of the quadrangle are diagonally positioned relative to directions in which the plurality of bumps are disposed.

7. The semiconductor package according to claim 1,
wherein the at least one pad of the chip component comprises a rectangular shape when viewed in the plan view of the semiconductor package, and
wherein the at least one pad is disposed so that sides of the rectangle are oriented in directions in which the plurality of bumps are arranged.

8. The semiconductor package according to claim 1, wherein the at least one pad of the chip component includes a pair of pads that are each disposed in opposing corner portions of an outer shape of the chip component when viewed in the plan view.

9. The semiconductor package according to claim 1, wherein the chip component comprises a substrate, a contact layer disposed adjacent to the substrate and a capacitive portion disposed on the contact layer.

10. The semiconductor package according to claim 9,
wherein capacitive portion comprises a pair of electrode layers with a dielectric layer disposed between, and
wherein the at least one pad is electrically connected to one of the pair of electrode layers by an extended electrode that extends through at least one inorganic protective layer disposed between the at least one pad and the pair of electrode layers.

11. The semiconductor package according to claim 10, wherein the chip component further comprises a metallic film extending in a vertical direction and disposed between an outer side of the chip component and at least one of the pair of electrode layers and the at least one inorganic protective layer.

12. The semiconductor package according to claim 1, wherein the chip component comprises a height less than a height of at least each of the pair of the plurality of bumps.

13. The semiconductor package according to claim 1, wherein the at least one pad of the chip component includes a pair of pads that are each disposed in opposing corner portions, with the pair of pads arranged in a row of the grid-shaped arrangement of the plurality of bumps.

14. A mounting structure comprising:
a printed circuit board;
a semiconductor package mounted on the printed circuit board, the semiconductor package including:
an interposer formed from silicon;
a semiconductor element mounted on a first surface of the interposer,
a plurality of bumps disposed on a second surface of the interposer that is opposite the first surface, and
a chip component disposed on the second surface of the interposer between at least a pair of the plurality of bumps,
wherein the chip component is a thin film element formed by a thin film process on a silicon substrate and includes at least one pad disposed on one surface of the thin film element and being connected to a land disposed on the second surface of the interposer using a conductive bonding material; and
a surface mount component mounted on the printed circuit board between the chip component and the printed circuit board, wherein the surface mount component directly faces the chip component with a space therebetween.

15. The mounting structure according to claim 14, wherein the surface mount component is a high-capacitance capacitor relative to the chip component between a low-capacitance capacitor.

16. The mounting structure according to claim 14, wherein the plurality of bumps are bonded to at least one land of the printed circuit board.

17. The mounting structure according to claim 14, wherein the interposer comprises at least one through-hole that electrically connects the semiconductor element to the chip component.

18. The semiconductor package according to claim 17, wherein the semiconductor element is a processor unit and the chip component is a bypass capacitor.

19. A mounting structure comprising:
a printed circuit board;
a semiconductor package mounted on the printed circuit board, the semiconductor package including:
an interposer formed from silicon;
a semiconductor element mounted on a first surface of the interposer,
a plurality of bumps disposed on a second surface of the interposer that is opposite the first surface, and
a chip component disposed on the second surface of the interposer between at least a pair of the plurality of bumps,
wherein the chip component is a thin film element formed by a thin film process on a silicon substrate and includes at least one pad disposed on a principal surface of the thin film element and being connected to at least one land disposed on the second surface of the interposer using a conductive bonding material, and
wherein the principal surface of the chip component faces the second surface of the interposer and has a terminal structure in which all of the at least one pad is disposed only on the principal surface of the chip component; and
a surface mount component mounted on the printed circuit board between the chip component and the printed circuit board.

* * * * *